United States Patent [19]

Bodensohn et al.

[11] Patent Number: 5,591,665
[45] Date of Patent: Jan. 7, 1997

[54] PROCESS FOR PRODUCING A SEMICONDUCTOR STRUCTURE INCLUDING A PLURALITY OF VERTICAL SEMICONDUCTOR DEVICES AND AT LEAST ONE LATERAL SEMICONDUCTOR DEVICE INTEGRATED IN A SEMICONDUCTOR BODY

[75] Inventors: Alexander Bodensohn, Hainburg; Heinz Henkel, Obertshausen, both of Germany

[73] Assignee: Daimler-Benz Aktiengesellschaft, Stuttgart, Germany

[21] Appl. No.: 284,558

[22] PCT Filed: Feb. 10, 1993

[86] PCT No.: PCT/EP93/00319

§ 371 Date: Aug. 9, 1994

§ 102(e) Date: Aug. 9, 1994

[87] PCT Pub. No.: WO93/17459

PCT Pub. Date: Sep. 2, 1993

[30] Foreign Application Priority Data

Feb. 12, 1992 [DE] Germany ............... 42 04 004.3

[51] Int. Cl.⁶ .................................................. H01L 21/302
[52] U.S. Cl. .................. 437/61; 437/68; 437/927; 437/974; 257/521; 257/527; 257/622; 257/627
[58] Field of Search ..................... 257/499, 500, 257/501, 502, 521, 527, 622, 627; 437/65, 66, 67, 68, 203, 927, 974

[56] References Cited

U.S. PATENT DOCUMENTS 4,977,101  12/1990  Yoder et al. .................. 437/51

FOREIGN PATENT DOCUMENTS

| 0147626 | 7/1985 | European Pat. Off. . |
| 0191476 | 8/1986 | European Pat. Off. . |
| 0193172 | 9/1986 | European Pat. Off. . |
| 0217288 | 4/1987 | European Pat. Off. . |
| 0316799 | 5/1989 | European Pat. Off. . |

*Primary Examiner*—Sara W. Crane
*Assistant Examiner*—David B. Hardy
*Attorney, Agent, or Firm*—Spencer & Frank

[57] ABSTRACT

A method is provided for forming a semiconductor device including a semiconductor body having a first surface and a second surface located opposite the first surface, with a plurality of vertical semiconductor components extending between the first and second surfaces. At least one partial structure having a lateral semiconductor component is disposed beneath the first surface. An electrically-insulating vertical wall surrounds the partial structure and extends into the semi-conductor body a predetermined depth from the first surface. The second surface of the semiconductor surface of the semiconductor body includes a recess in the region of the partial structure. The bottom of the recess extends to the vertical wall at the predetermined depth from the first surface. An insulating layer covers the bottom of the recess.

12 Claims, 4 Drawing Sheets

PROCESS FOR PRODUCING A SEMICONDUCTOR STRUCTURE INCLUDING A PLURALITY OF VERTICAL SEMICONDUCTOR DEVICES AND AT LEAST ONE LATERAL SEMICONDUCTOR DEVICE INTEGRATED IN A SEMICONDUCTOR BODY

BACKGROUND OF THE INVENTION

The invention relates to a method for producing a semiconductor structure having a plurality of vertical and at least one lateral semiconductor component integrated in a disk-shaped semiconductor body having a first surface and a second surface opposite the first surface, with the lateral semiconductor components being disposed beneath the first surface, and the plurality vertical semiconductor components extending between the first and the second surfaces. The at least one lateral semiconductor component being disposed inside a partial structure which is insulated from adjacent regions. The thickness of the semiconductor body is reduced in the region of the partial structure. As used herein, the term semiconductor component is intended to mean semiconductor device or devices integrated into a semiconductor body.

A method of producing, such a semiconductor structure is disclosed in EP-A-0,193,172. In this instance, a vertical MOS transistor is described which is disposed in a semiconductor body along with a lateral switching circuit. The MOS transistor and the lateral switching circuit are isolated from one another by a p-n junction. It does not follow from EP-A-0,193,172 to integrate a plurality of vertical components in the semiconductor body. A disadvantage in the disclosed type of insulation EP-A-0,193,172 is that the space-charge region present at the p-n junction requires a great deal of space that cannot be used for the insertion of components. Moreover, the doping of the regions lying adjacent to the isolation cannot be freely selected; namely— for obtaining a space-charge region—a p-doped and an n-doped zone must always be present alternatingly so that a p-n junction results. Furthermore, it is disadvantageous that, at a p-n junction, the correct polarity (in the blocking direction) must be heeded, because otherwise the isolating effect of the junction is lost. The permitted potential in the one region is therefore a function of that in the other region—located behind the p-n junction.

SUMMARY OF THE INVENTION

The object of the invention is to provide a method of producing a semiconductor structure having a plurality of integrated semiconductor components, and to provide such a semiconductor structure that includes, in addition to at least one lateral semiconductor component, a plurality of vertical semiconductor components which can be operated independently thereof, in the smallest space.

The object for the method is accomplished in accordance with the invention by means of the method for producing a semiconductor structure including at least one partial structure having a lateral semiconductor component with an electrically-insulating vertical wall surrounding the partial structure and extending into the semiconductor body a predetermined depth; and a recess formed in the semiconductor body in a region on a side opposite the partial structure such that the bottom of the recess is approximately equal to the depth of the vertical wall. The object for providing the semiconductor structure is accomplished in accordance with the invention by a semiconductor structure produced by the method of the invention.

In the method, no damage occurs in the crystal structure. To produce the semiconductor structure, known diffusion methods are used, in which the contacting and passivation of predetermined surface regions can be performed with conventional methods. The method permits the use of identical partial structures for power and signal components. The vertical components differ from the lateral ones in the doping of the deeper layers, among other things.

In the semiconductor structure according to the invention, a plurality of vertical semiconductor components are integrated in a semiconductor body. The semiconductor structure can be designed such that lateral semiconductor components, serving as signal elements for vertical power components positioned outside of the partial structures, are disposed inside the partial structures.

Other modifications of the invention are to be taken from the dependent claims.

DETAILED DESCRIPTION OF THE PREFERRED EMBODIMENT

Figure 1:
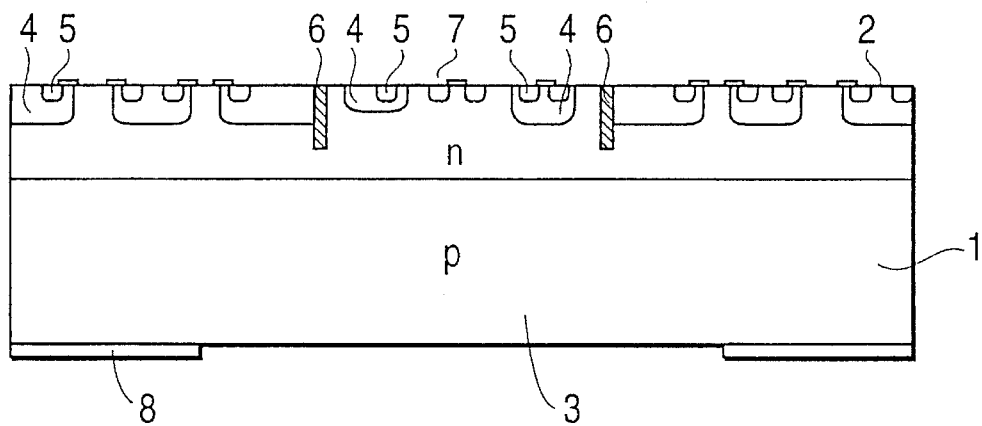
FIG. 1 shows a disk-shaped semiconductor body having partial structures already produced before division into the regions for the lateral and the vertical components.

In the embodiment, the departure is made in FIG. 1 from a disk-shaped semiconductor body (1) of silicon which has a first surface (2) and a second surface (3). By means of diffusion, first regions (4) are produced, into which partial regions (5) are cut by a further diffusion step. In this instance the regions (4) and partial regions (5) are provided for the integration of both lateral semiconductor components and vertical semiconductor components. In the production of a plurality of lateral semiconductor components beneath the surface (2) of the semiconductor body (1), it is conventional to insulate these semiconductor components in their surroundings against adjacent regions of the semiconductor body (1), so that they can operate independently from adjacent semiconductor components. For lateral insulation, first insulating walls (6) that laterally surround the partial structure (7) are created to a specific depth.

These insulating walls (6) are produced in a known manner in that trenches are produced by plasma etching that are subsequently filled with an insulating material. Furthermore, an etching mask (8) is applied to the second surface (3). Because FIG. 1, like the subsequent figures, only shows partial sections of a semiconductor body (1) having a plurality of structure regions, a plurality of partial structures (7) are present on the entire semiconductor body (1), so that the etching mask (8) is structured correspondingly such that the region of the surface (3) located beneath the partial structure (7) is not covered by the etching mask (8).

The vertical semiconductor components differ from the lateral components, among other things, in the doping of the deeper layers, and are power components, whereas the lateral semiconductor components are signal components.

Figure 2:
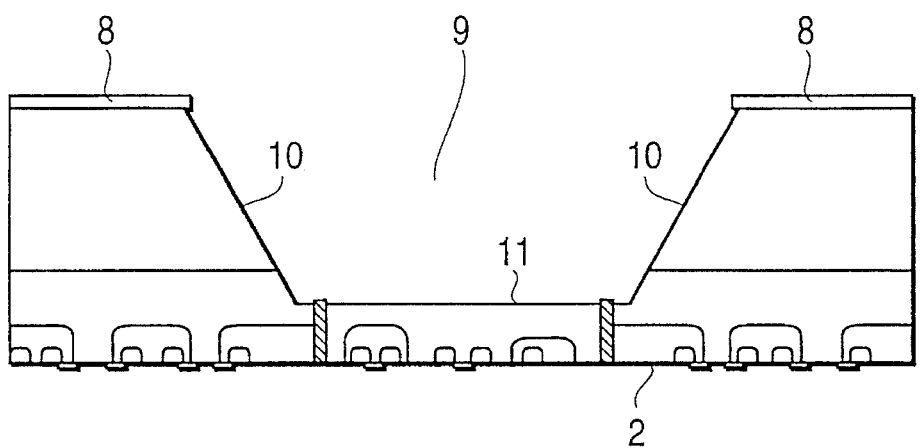
FIG. 2 shows the semiconductor body following the cutting of a recess.

The production of a recess (9) is explained with reference to FIG. 2. In the embodiment, the recess (9) is intended to be produced by an anisotropic etching process. For this purpose a semiconductor body (1) is used whose surface has a crystal structure along a <100> plane. For etching, a KOH solution is used that attacks the material in such a way that the side walls (10) are a <111> plane. Through the etching process, the thickness of the semiconductor body (1) is reduced in the region of the recess (9) so that the bottom (11) of the recess (9) extends up to the walls (6), thereby forming a silicon diaphragm whose thickness is approximately equal to the depth of the walls (6).

For simplification and better handling, and if needed, a reinforcement of the silicon diaphragm, for example a layer of polyimide, can be applied to the rear side, that is, on surface (2).

Figure 3:
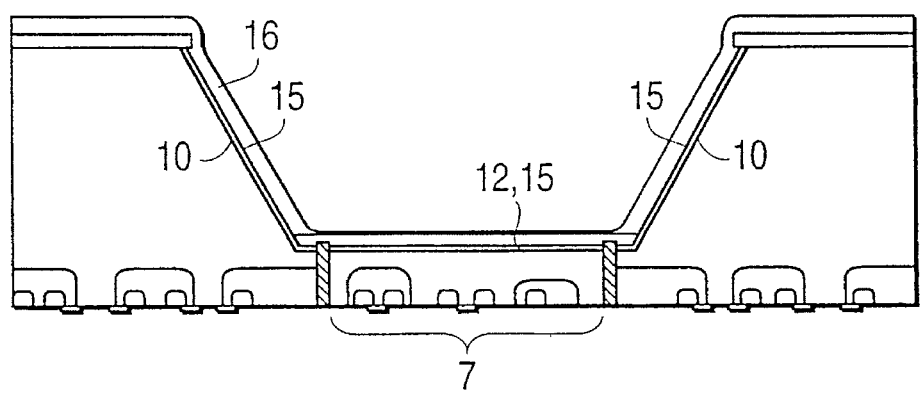
FIG. 3 shows the semiconductor body following further process steps.

The bottom (11) is covered with an electrically insulating layer (12), for example, a silicon oxide layer, as shown in FIG. 3. The partial structure (7) is now electrically insulated on all sides against its surroundings, and represents a lateral semiconductor component until contacts are formed.

To achieve an even better functional separation of the integrated semiconductor components, it is favorable not only to cover the bottom (11) of the etching trench (9), but also its walls (10) with an oxide layer, which is shown in FIG. 3 by reference numeral (15). When this oxide layer is generated by thermal oxidation, the surface regions that are not supposed to be oxidized are covered by an $Si_3N_4$ layer. The oxide layer (15) is then covered with an electrically poorly-conductive layer (16) (passivation layer) which can be composed of, for example, amorphous carbon or amorphous silicon carbide. These materials are electrically poorly conductive, but have a good thermal conductivity and are intended to serve essentially in dissipating waste heat generated by the components. It is also possible to directly apply this poorly-conductive layer (16) directly without prior oxidation; then, due to a lack of oxidation, the semiconductor body (1) can be substantially completely processed at a high temperature prior to anisotropic etching. Because the metalization and the passivation can be applied and structured prior to etching, the process is simplified.

Figure 4:
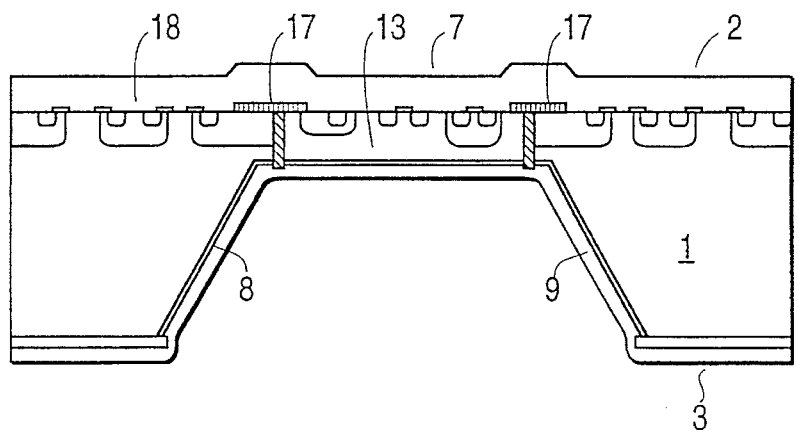
FIG. 4 shows the further processing of the semiconductor body on the first surface.

As shown in FIG. 4, contacts (17) serve to contact partial structure (7) for preparing the lateral semiconductor components (13) to function as intended. The contacts of vertical semiconductor components which are located outside the partial structure (7) are applied and structured simultaneously with the contacts (17). The surface (2) is then covered with a passivation layer (18).

Figure 5:
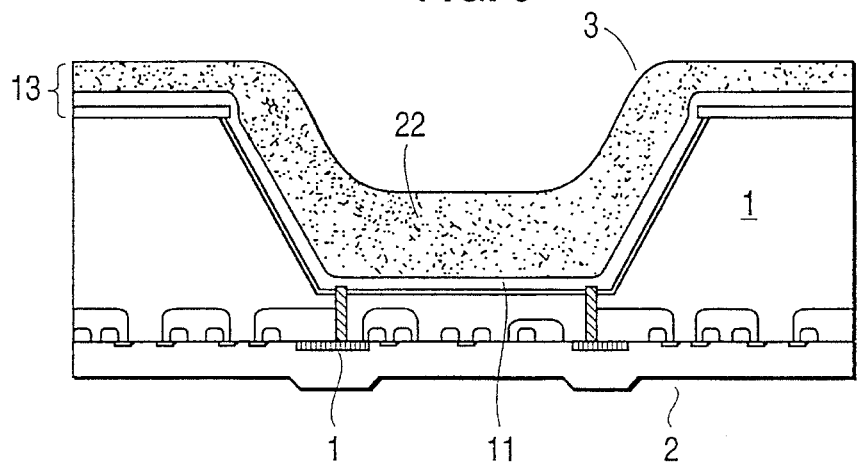
FIG. 5 shows the semiconductor body following further processing on the second surface.

The surface (3) is subsequently covered with photoresist (22) (FIG. 5)—multiple times, if necessary. The photoresist (22) is applied so that the etching trench (9) is covered with a thicker layer than the regions on the second surface (3). A dry-etching process follows as the next method step, in which the layer system of photoresist (22), the electrically poorly-conductive layer (16) and the $S_i3N_4$ layer is removed up to a part of the layer in the etching group (9). Because of the thicker layer in the etching group (9), only a partial layer is stripped. In this dry-etching process, the surface (3) of the semiconductor body (1) is exposed, and is thus available for selective contacting systems or for production of alloy contacts.

Figure 6:
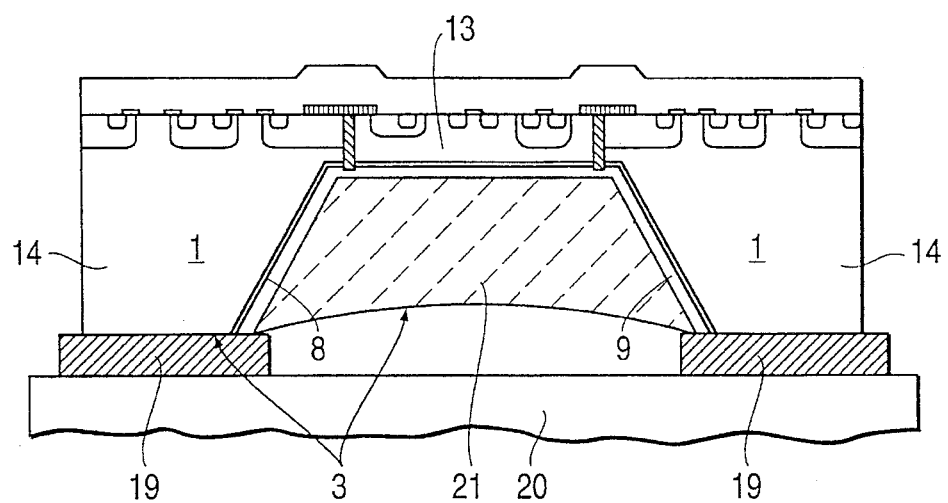
FIG. 6 shows the semiconductor body having the structure of lateral and vertical components.

FIG. 6 shows a semiconductor body (1) having contacts produced in the above manner. In this instance, the semiconductor body (1) is applied to a substrate (20) having a structured metalization (19), e.g., gold. In an alloy process, the silicon and the metalization bond produce a high-quality contact.

To reinforce the silicon diaphragm—that is, the bottom (11) of the recess (9)—a filler material (21)—for example photoresist—can be applied prior to forming contacts, so that pressure loads and mechanical influences can be damped. The above-mentioned photoresist (22) is a layer which is only used periodically and supports the selective, self-adjusting structuring (dry-etching process) of the surface (3), and assures the stability of the etched semiconductor body (1) for the duration of the subsequent method steps. In contrast, the filler material (21) is a long-lasting support of the silicon diaphragm, and if need be, permits a structured metalization of the surface (3) in conventional photolithographic methods.

For non-selective metalizations, it is also possible to planate the surface (3). Then, the semiconductor body surface (3) facing away from the lateral components (13) can be completely metalized and subsequently structured.

Figure 7:
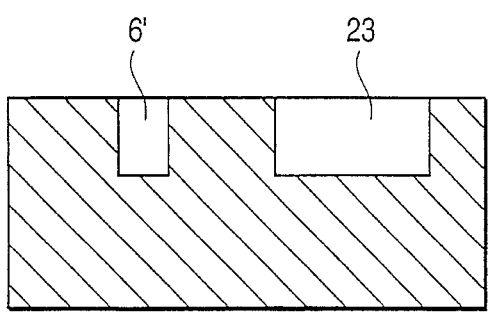
FIG. 7 shows a further semiconductor body following dry-etching of isolating trenches.
Figure 8:
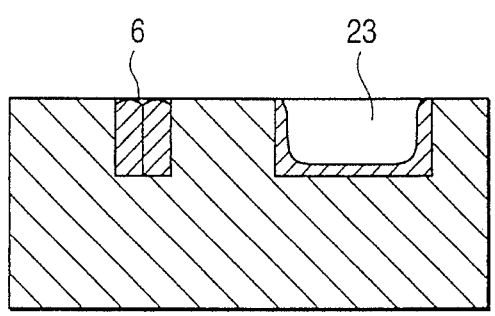
FIG. 8 shows the semiconductor body according to FIG. 7 following a further processing step.

FIG. 7 shows a silicon disk having a separating trench (6') (of course, the insertion of a plurality of separating trenches (6') is also conceivable). A recess or a further trench is provided in addition to the separating trenches (6'). The trench has the same depth as the separating trench (6'), but has a greater width than the separating trench. This trench is designated as test window (23) in FIGS. 7 and 8. The separating trench (6') and the test window (23) are filled; however, because of the larger opening of the test window (23), the test window is not completely filled, as opposed to the separating trench (6'). Therefore, after the subsequent planating oxide etching on the bottom of the test window (23), only a thin oxide layer remains.

Figure 9:
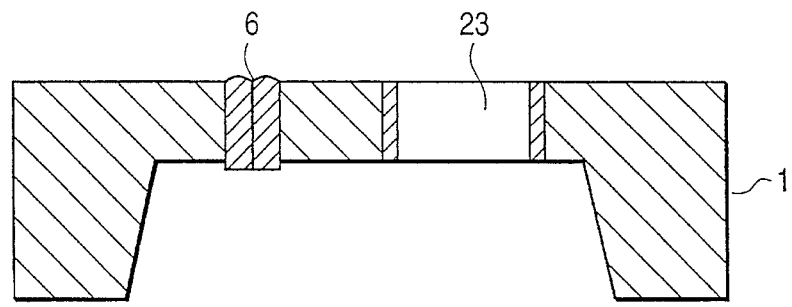
FIG. 9 shows the semiconductor body according to FIG. 7 following the obtainment of a test window.

FIG. 9 shows the silicon disk having the test window (23) following anisotropic etching.

The two structures in FIG. 9 are shown following anisotropic etching. When the etching trenches reach the test window (23), because of the only thin layer, ruptures are obtained that can be visually recognized. Because the test windows (23) have the same depth as the separating trenches (6'), the etching can be controlled. Later lacquering of the semiconductor body (1) is impaired by the ruptures in the test windows (23); therefore, these test structures are preferably positioned in the edge region of the semiconductor body (1).

Figure 10:
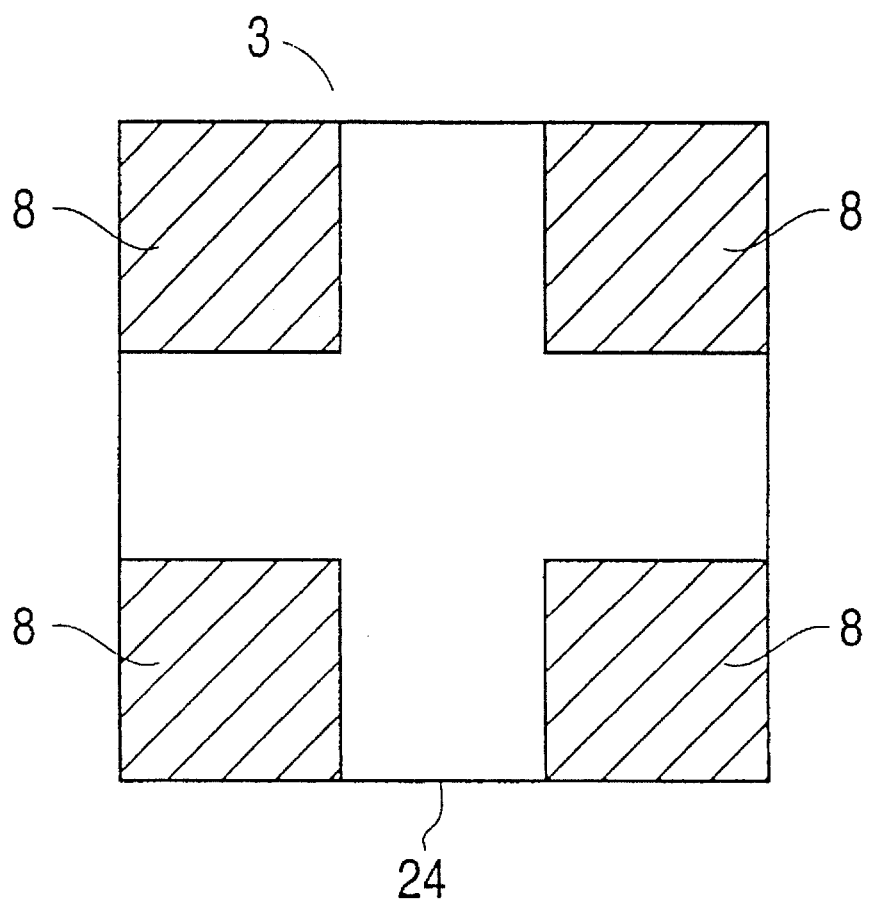
FIG. 10 shows a disk-shaped semiconductor body having a plurality of vertical power components.

With the invention, it is possible to produce a semiconductor structure having a plurality of integrated, vertical semiconductor components in that a corresponding structure is provided. FIG. 10 shows the second surface (3) of a semiconductor disk (24) having four power components with etching masks (8) shown. In particular, two or more such components can be accommodated in the same semiconductor body by a symmetrical arrangement of the power components. The power components are particularly disposed at the corners of the parallelepiped semiconductor body. According to FIG. 10, each corner has a vertical power component.

In the semiconductor structure produced according the above-described method, equipotential surfaces are favorably influenced by an insulating rear side of the silicon diaphragm—that is, by an insulation of the surface (3) at the height of the recess (9). By this, it is also possible to configure lateral semiconductor components for high voltages (e.g., 1000 V) in the partial structure (7)—inside the thin diaphragm—and conventional, monolithically integrated semiconductor circuits in regions outside of the partial structure (7).

We claim:

1. A method for producing a semiconductor structure having a plurality of vertical semiconductor devices and at least one lateral semiconductor device integrated in a semiconductor body, the semiconductor body having a first surface and a second surface located opposite the first surface, the second surface having a crystal structure along a <100> plane, the vertical semiconductor devices extending between the first and second surfaces and the at least one lateral semiconductor device being disposed beneath the first surface, the method comprising the steps of:
    a) forming at least one partial structure having the at least one lateral semiconductor device;
    b) forming a plurality of doped regions on the first surface of the semiconductor body outside of the partial structure;
    c) forming a plurality of partial regions embedded in the plurality of doped regions;
    d) surrounding the partial structure with an electrically-insulating wall extending to a first predetermined depth into the semiconductor body from the first surface;
    e) reducing a thickness of the semiconductor body to form a recess in the second surface in a region of the partial structure up to at least the electrically-insulating wall at the first predetermined depth from the first surface by etching the second surface using a KOH solution as an etching solution so that walls of the recess lie in a <111> plane of the semiconductor body;
    f) applying an insulating layer to a bottom of the recess; and
    g) applying at least one of a metalization layer and passivation layer to the first and second surfaces for forming the at least one lateral semiconductor component and the vertical semiconductor components.

2. A method according to claim 1, wherein the second surface of the semiconductor body has a crystal structure along a <100> plane, wherein the step of reducing the thickness of the semiconductor body includes etching the second surface using a KOH solution as an etching solution so that walls of the recess lie in a <111> plane of the semiconductor body.

3. A method according to claim 1, further comprising the step of covering the bottom of the recess with a silicon oxide layer.

4. A method according to claim 3, further comprising the step of selectively covering regions of the semiconductor body with a $Si_3N_4$ layer before the step of covering the bottom of the recess with a silicon oxide layer, and
    wherein the silicon oxide layer is produced by thermal oxidation.

5. A method according to claim 3, further comprising the step of covering the silicon oxide layer with an electrically non-conductive layer.

6. A method according to one of claim 1, wherein the partial structure having the lateral device is in a region of the semiconductor body having a conductivity type which is opposite the conductivity type of the semiconductor body.

7. A method according to claim 6, wherein the step of forming the plurality of partial regions includes the step of forming a partial region having at lest one of a predetermined conduction type and a predetermined doping concentration for determining a device type formed in a doped region of the plurality of doped regions.

8. A method according to claim 1, further comprising the step of forming a silicon oxide layer on the bottom and on walls of the recess.

9. A method according to claim 1, further comprising the step of filling the recess at least partially with a filler material.

10. A method according to claim 1, wherein the semiconductor body is disk-shaped.

11. A method for producing a semiconductor structure having a plurality of vertical semiconductor devices and at least one lateral semiconductor device integrated in a semiconductor body, the semiconductor body having a first surface and a second surface located opposite the first surface, the vertical semiconductor devices extending between the first and second surfaces and the at least one lateral semiconductor device being disposed beneath the first surface, the method comprising the steps of:
    a) forming at least one partial structure having the at least one lateral semiconductor device;
    b) forming a plurality of doped regions on the first surface of the semiconductor body outside of the partial structure;
    c) forming a plurality of partial regions embedded in the plurality of doped regions;
    d) surrounding the partial structure with an electrically-insulating wall extending to a first predetermined depth into the semiconductor body from the first surface by steps including:
        plasma etching the first surface of the semiconductor body to form a trench for the electrically-insulating wall; and
        filling the trench with an electricallyinsulating material;
    e) reducing a thickness of the semiconductor body to form a recess in the second surface in a region of the partial structure up to at least the electrically-insulating wall at the first predetermined depth from the first surface
    f) applying an insulating layer to a bottom of the recess; and
    g) applying at least one of a metalization layer and passivation layer to the first and second surfaces for forming the at least one lateral semiconductor component and the vertical semiconductor components.

12. A method for producing a semiconductor structure having a plurality of vertical semiconductor devices and at least one lateral semiconductor device integrated in a semiconductor body, the semiconductor body having a first surface and a second surface located opposite the first surface, the vertical semiconductor devices extending between the first and second surfaces and the at least one lateral semiconductor device being disposed beneath the first surface, the method comprising the steps of:
    a) forming at least one partial structure having the at least one lateral semiconductor device;
    b) forming a plurality of doped regions on the first surface of the semiconductor body outside of the partial structure;

c) forming a plurality of partial regions embedded in the plurality of doped regions;

d) surrounding the partial structure with an electrically-insulating wall extending to a first predetermined depth into the semiconductor body from the first surface;

e) reducing a thickness of the semiconductor body to form a recess in the second surface in a region of the partial structure up to at least the electrically-insulating wall at the first predetermined depth from the first surface;

f) applying an insulating layer to a bottom of the recess;

g) applying at least one of a metalization layer and passivation layer to the first and second surfaces for forming the at least one lateral semiconductor component and the vertical semiconductor components;

h) forming a test window trench in the semiconductor body having a depth which coincides with the depth of the electrically-insulating wall and having a width which is greater than a width of the electrically-insulating wall; and i) reducing the thickness of the semiconductor body at the test window trench until a bottom of the test window trench is ruptured.

* * * * *